US006777721B1

(12) United States Patent
Huang et al.

(10) Patent No.: US 6,777,721 B1
(45) Date of Patent: Aug. 17, 2004

(54) SCR DEVICE FOR ESD PROTECTION

(75) Inventors: Cheng Huang, Cupertino, CA (US); Yowjuang (Bill) Liu, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 10/298,104

(22) Filed: Nov. 14, 2002

(51) Int. Cl.[7] .............................................. H01C 29/74
(52) U.S. Cl. ........................ 257/111; 257/112; 257/122
(58) Field of Search ................................ 257/107–356, 257/361

(56) References Cited

U.S. PATENT DOCUMENTS 5,602,404 A * 2/1997 Chen et al. .................. 257/112
5,872,379 A * 2/1999 Lee ............................. 257/355

* cited by examiner

Primary Examiner—H. Jey Tsai
(74) Attorney, Agent, or Firm—Morgan Lewis & Bockius LLP (57) ABSTRACT

The present invention provides a novel ESD structure for protecting an integrated circuit (IC) from ESD damage and a method of fabricating the ESD structure on a semiconductor substrate. The ESD structure of the present invention has lower trigger voltage and lower capacitance, and takes smaller substrate area than prior art ESD structures. The low trigger voltage is provided by a small $N^+P$ diode or a $P^+N$ diode which has a PN junction with a much lower breakdown voltage than a PN junction between a N+ (or P+) source/drain region and a P-well (or N-well). All of the diffusion regions in the ESD device of the present invention can be formed using ordinary process steps for fabricating the MOS devices in the IC and does not require extra masking steps in addition to those required to fabricate the IC.

20 Claims, 6 Drawing Sheets

SCR DEVICE FOR ESD PROTECTION

FIELD OF THE INVENTION

The present invention relates to electronic devices, and more specifically to electrostatic discharge (ESD) protection structures for protecting an integrated circuit from ESD damage.

BACKGROUND OF THE INVENTION

ESD protection has been a main concern in the reliability of integrated circuit (IC) products in submicron complimentary metal-oxide-silicon (CMOS) technologies. For example, drain diffusion regions in N-type metal-oxide-silicon (NMOS) and P-type metal-oxide silicon (PMOS) transistors in output buffers of a CMOS IC are often directly connected to output pads of the IC in order to drive external loads of the IC, causing the CMOS output buffers to be vulnerable to ESD damage. To improve ESD robustness of a CMOS output buffer, the NMOS and PMOS transistors in the output buffer are usually designed with large device dimensions. But the increase in the device dimensions in output buffers is inconsistent with the general trend to reduce device size. Therefore, efforts have been made to design ESD protection structures in the input and output circuitry of an IC that offer sufficient ESD protection while taking up as little area in the IC as possible. In addition, high speed pins of the IC often require low capacitance in the associated circuitry. Therefore, efforts have also been made to design ESD protection structures with low capacitance.

Lateral semiconductor-controlled rectifier (SCR) devices have been widely used in ESD-protection structures for input protection in submicrometer CMOS IC's. See R. N. Rountree, et al., "A Process-Tolerant Input Protection Circuit for Advanced CMOS Proceses," 1988 EOS/ESD Symposium Proceedings, p. 201. For the output buffers, a low-voltage triggering SCR (LVTSCR) with an inserted NMOS transistor in a lateral SCR structure has been used to provide a much lower trigger voltage than a conventional SCR. The inserted NMOS transistor in the LVTSCR is designed with its gate grounded to provide a low breakdown voltage for the drain-substrate diode at the gate edge. The low breakdown voltage leads to a low trigger voltage for the LVTSCR. Thus the ESD trigger voltage of the LVTSCR device is equivalent to a snap-back trigger voltage of the inserted short-channel NMOS transistor, which is typically much lower than a switching voltage of the original lateral SCR device. See A. Chatterjee, et al., "A Low-Voltage Triggering SCR for On-chip ESD Protection at Output and Input Pad," IEEE Electron Device Letters, Vol. 12, No. 1, January 1991, p. 21. However, the LVTSCR device can have a higher than desirable capacitance due to the usage of the NMOS transistor as the trigger device.

Another SCR structure that offers a low trigger voltage is the triple well SCR device presented by Nikolaidis and Papadas in "A Novel SCR ESD Protection for Triple Well CMOS Technologies," IEEE Electron Device Letters, Vol. 22, No. 4, April 2001, p. 185. This device incorporates a P-well to trigger an RC circuit, and provides a trigger voltage even lower than that of the LVTSCR device. However, the use of the P-well is disadvantageous because it requires more area on the substrate.

SUMMARY OF THE INVENTION

The present invention provides a novel ESD structure for protecting an IC from ESD damage and a method of fabricating the ESD structure on a semiconductor substrate. The ESD structure of the present invention meets the requirements of low trigger voltage and low capacitance, and requires less substrate area than prior art ESD structures. The low trigger voltage is provided by a small $N^+P$ diode or a $P^+N$ diode which has a PN junction with a much lower breakdown voltage than a PN junction between a N+ (or P+) source/drain region and a P-well (or N-well). All of the diffusion regions in the ESD device of the present invention can be formed using ordinary process steps for fabricating the MOS devices in the IC and do not require additional masking steps beyond those already required to fabricate the IC. In one embodiment of the present invention, the lighter doped diffusion region of the $N^+P$ or $P^+N$ diode can be formed using a lightly doped drain (LDD) implant process for forming LDD diffusion regions in the IC, and the higher doped diffusion region of the NP or $P^+N$ diode can be formed using a source/drain implant process for forming source/drain diffusion regions in the IC. The ESD device of the present invention also takes up very little area on a semiconductor substrate because it has a very compact layout and does not require any MOS devices for triggering. The compact layout and the absence of a MOS trigger device also lead to low capacitance for the input or output pads being protected.

BRIEF DESCRIPTION OF THE DRAWINGS

For a more complete understanding of the present invention and advantages thereof, reference is now made to the following description taken in conjunction with the accompanying drawings.

DETAILED DESCRIPTION OF THE INVENTION

Figure 1A:
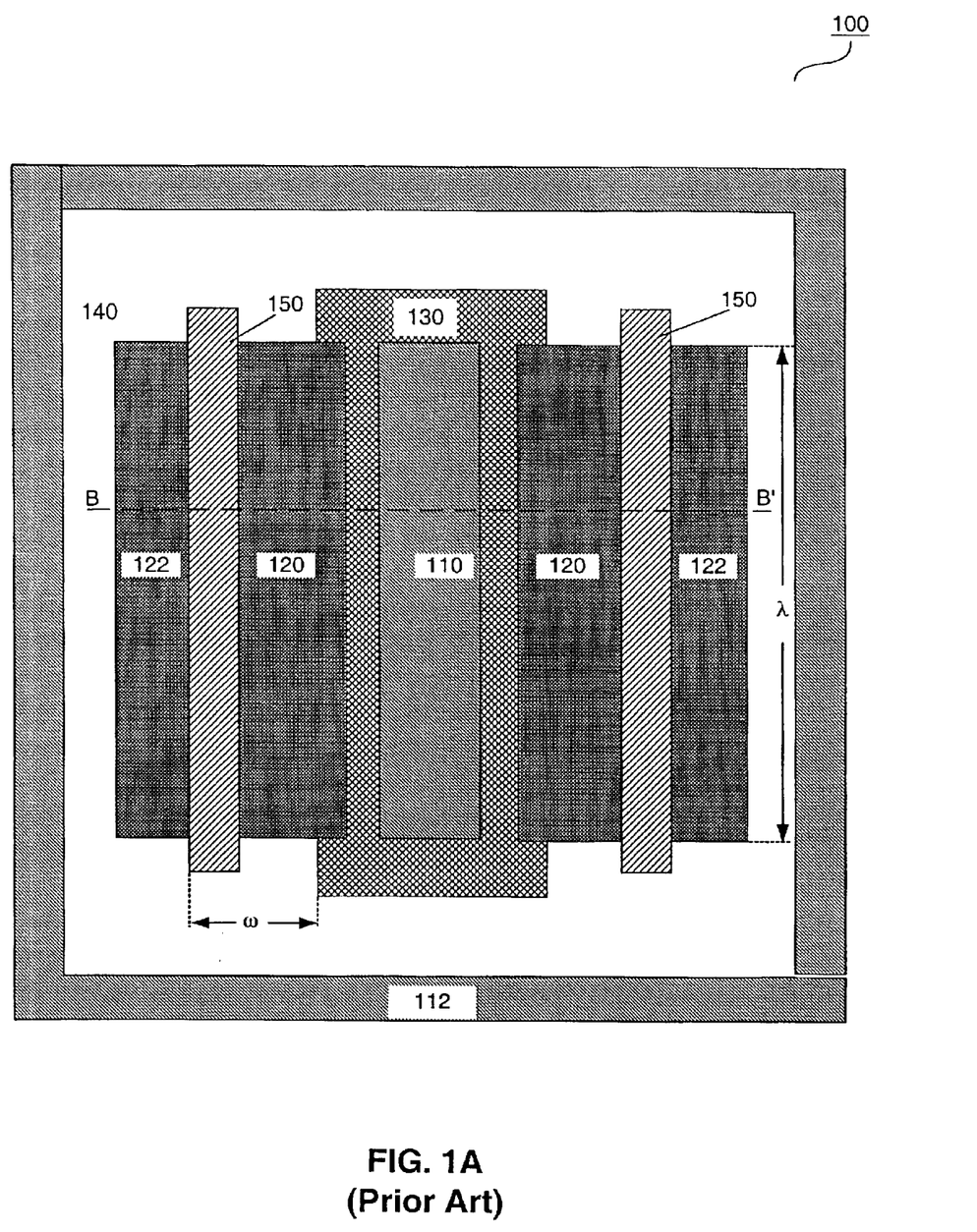
FIG. 1A is a block diagram of a top view of a prior art ESD protection structure.
Figure 1B:
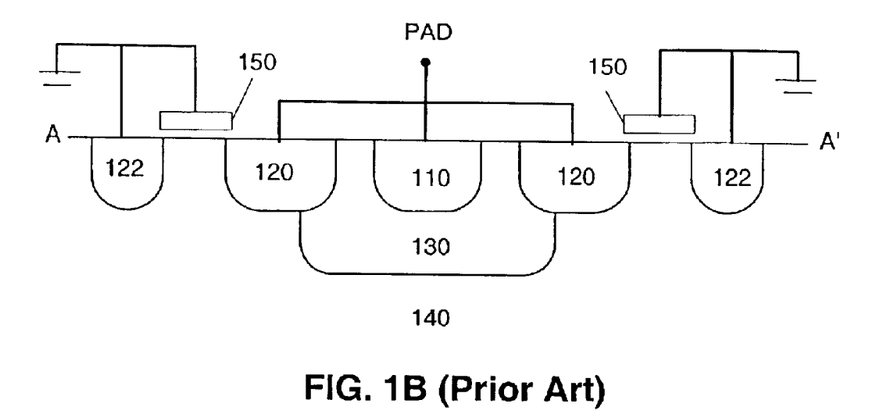
FIG. 1B is schematic drawing of a cross-sectional view of the prior art ESD protection structure in FIG. 1A.

FIGS. 1A and 1B illustrate a prior art LVTSCR ESD protection structure 100: FIG. 1A is a block diagram of a top view of structure, and FIG. 1B is a schematic drawing of a cross section of structure 100 along line B–B' in FIG. 1A. As shown in FIG. 1A, structure 100 comprises a P+ diffusion region 110 formed in a N-well 130 in a P-type substrate 140. Structure 100 further comprises one or more NMOS-like structures each having a gate 150 over the substrate 140, and two N+ diffusion regions, a source region 122 and a drain region 120, formed in substrate 140 on opposite sides of gate 150. Structure 100 may be surrounded by a P+ guard ring 112. As shown in FIG. 1B, P+ diffusion-region 110 and N+ drain regions 120 are connected to an input or output terminal (or pad) of an integrated circuit (IC), which is protected by structure. Source regions 122 and gate 150 are connected to the ground (or $V_{SS}$) of the IC. Thus, P+ diffusion region 110 and N+ drain regions 120 are usually called the anode of structure, and source regions 122 are usually called the cathode of structure.

Figure 1C:
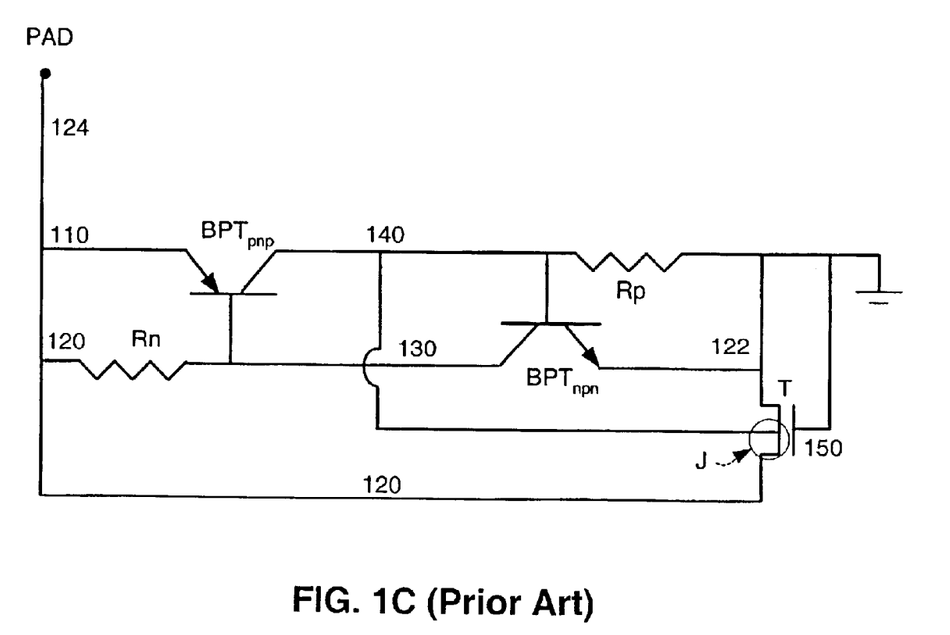
FIG. 1C is a circuit schematic of the prior art ESD protection structure shown in FIGS. 1A and 1B.

FIG. 1C is a circuit schematic of structure. As shown in FIG. 1C, structure 100 includes a lateral SCR structure having two parasitic bipolar transistors, a PNP bipolar transistor $BPT_{PNP}$ and a NPN bipolar transistor $BPTN_{NPN}$, associated with structure 100. P+ diffusion region 110, N-well 130, and P-type substrate 140 form the emitter, base and collector regions, respectively, of the $BPT_{PNP}$ transistor. N+ source regions 122, P-type substrate 140, and N-well 130 form the emitter, base and collector, respectively, of the $BPT_{NPN}$ transistor. Resistor Rn is formed by the sheet resistance associated with N-well 130, and resistor Rp is formed by the sheet resistance associated with the P-type substrate 140.

The NMOS-like structures in structure 100 are represented by the NMOS transistor T having a grounded gate 150, and two N+ diffusion regions, source 122 and drain 120, in substrate 140. As shown in FIGS. 1A and 1B, the N+ drain 120 is connected to the pad and the N+ source 122 is connected to ground. The PN junction J formed by the N+ drain 120 and the P-substrate 140 under the grounded gate 150 is used to trigger the SCR in structure 100.

The triggering of the SCR structure in structure 100 from an "off" state to an "on", state occurs as a result of positive feedback of the two bipolar transistors $BPT_{NPN}$ and $BPT_{PNP}$. The positive feedback is initiated by charge injection into the base regions 140 and 130 of the bipolar transistors when an ESD pulse occurs at the pad. With the charge injection, resistor Rp provides a necessary voltage drop for turning on $BPT_{npn}$ and resistor Rn provides a necessary voltage drop for turning on $BPT_{pnp}$. If the NMOS transistor T were not in the circuit, this charge injection is triggered by an avalanche breakdown of the reverse-biased PN junction formed by p-substrate 140 and N-well 130 resulting from the ESD pulse. Because both substrate 140 and N-well 130 are lightly doped, this breakdown would occur at a relatively high voltage, which may be too high to provide sufficient protection for the IC.

The LVTSCR structure 100 can have a significantly lower ESD trigger voltage than conventional lateral SCR structures because of the inserted NMOS transistor T. One reason for this is that the avalanche breakdown in structure 100 in response to an ESD pulse at the pad occurs near the gated PN junction J between N+ drain 120 and p-substrate 140. Because junction J is under a grounded gate and the N+ drain 120 has a much higher dopant concentration than that of the N-well 130, this breakdown can occur at a much lower voltage.

Although the LVTSCR structure 100 can provide sufficiently low ESD trigger voltage to NMOS devices in an input or output circuit of an integrated circuit, it has several problems associated with the introduction of the NMOS-like structures. First, the LVTSCR structure 100 has a large capacitance due to the large N-well 130 and the large N+ drain diffusions 120 in the NMOS-like structures. The large capacitance makes the LVTSCR unsuitable for protecting high-speed integrated circuits from ESD damage. Furthermore, because of the use of the NMOS-like structure, there is a concern about gate oxide breakdown in the LVTSCR structure 100 during an ESD event.

The ESD structure of the present invention avoids the above disadvantages of the prior art ESD protection structures by providing a low ESD trigger voltage while avoiding the use of a MOS-like structure. FIGS. 2A–2D illustrate an ESD protection structure 200 built on a semiconductor substrate, according to one embodiment of the present invention.

Figure 2A:
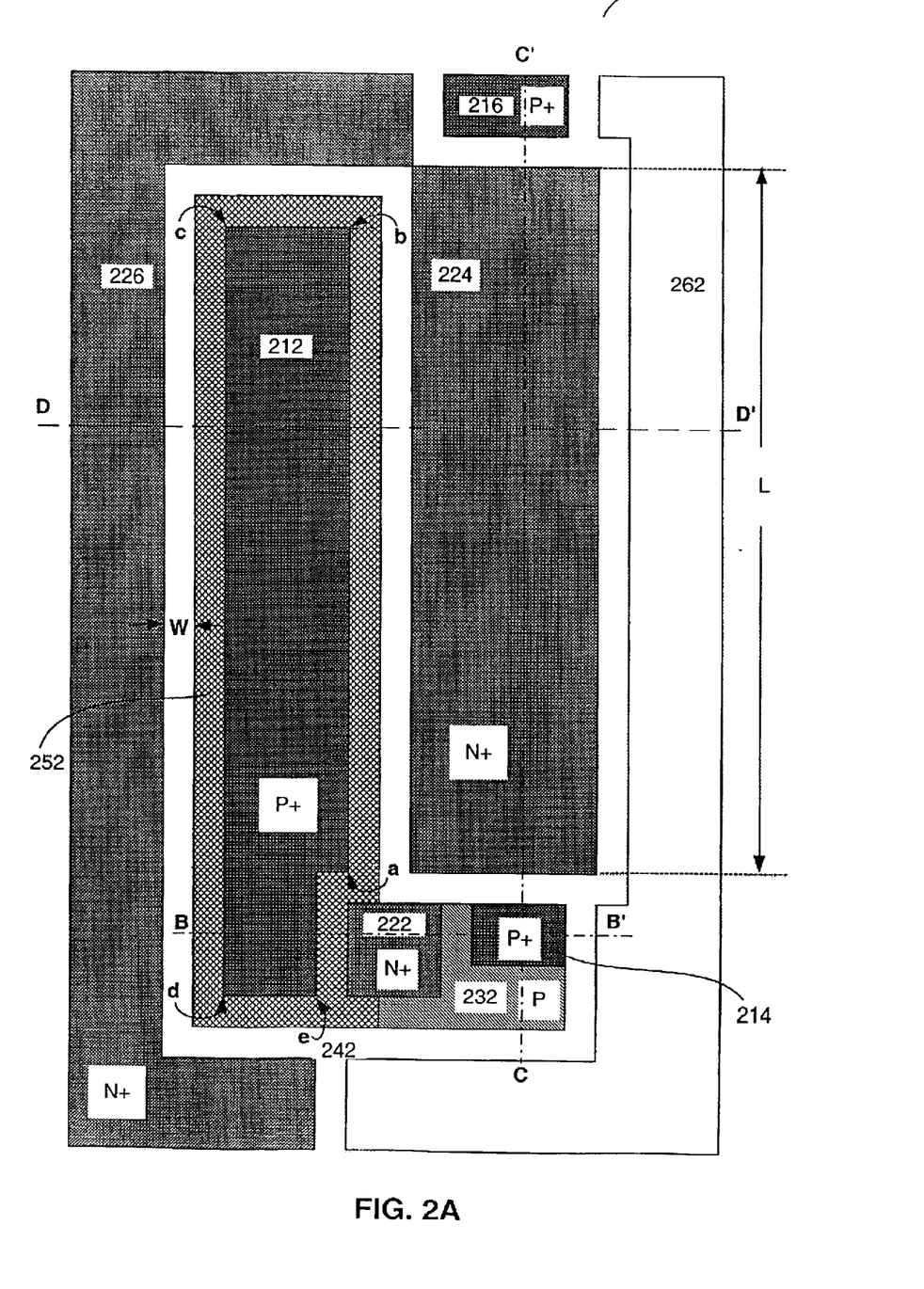
FIG. 2A is a block diagram of a top view of an ESD protection structure according to one embodiment of the present invention.
Figure 2B:
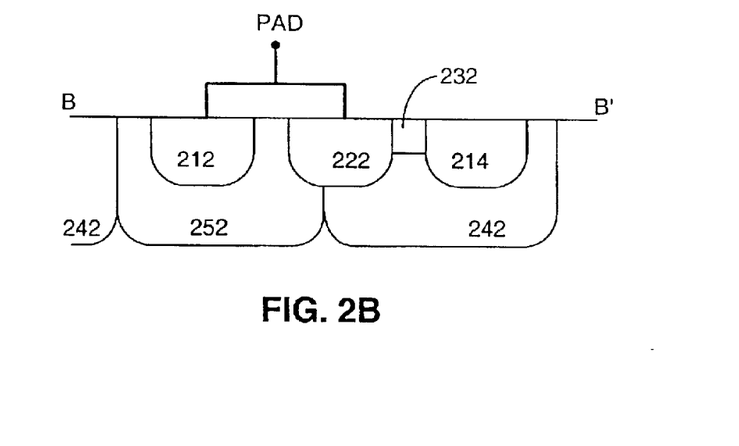
FIGS. 2B to 2D are schematic drawings of cross-sectional views of the ESD protection device in FIG. 2A.
Figure 2C:
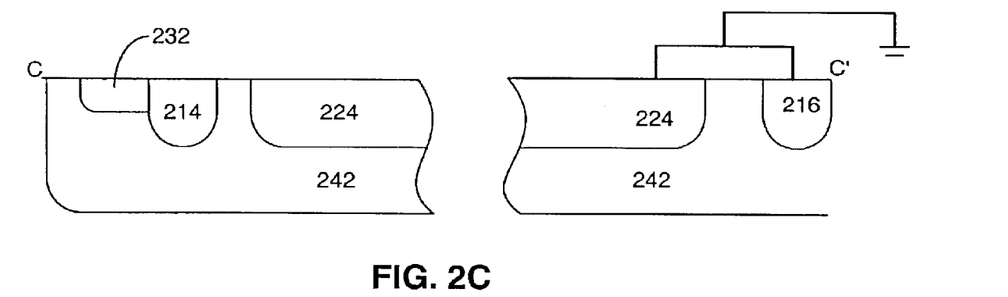
Figure 2D:
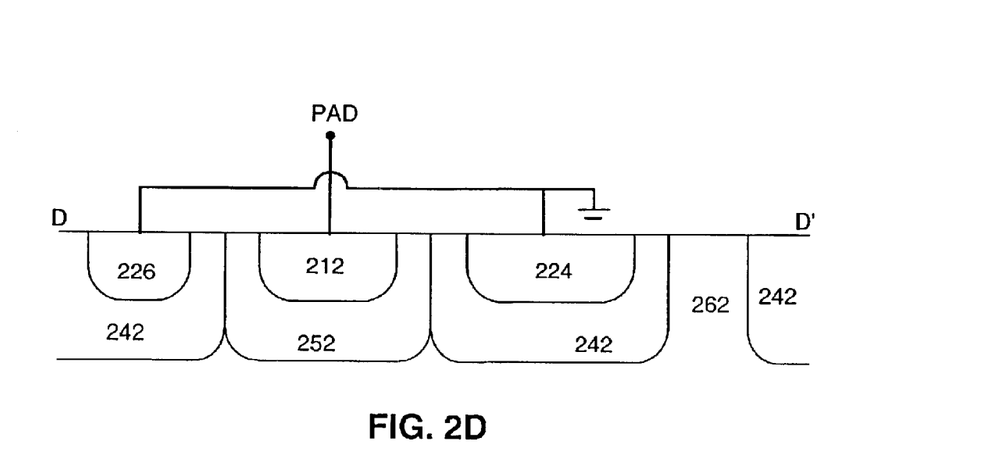

FIG. 2A is a block diagram of a top view of structure 200, FIG. 2B is a schematic drawing of a cross section of structure 200 along line B–B' in FIG. 2A, FIG. 2C is a schematic drawing of a cross section of structure 200 along line C–C' in FIG. 2A, and FIG. 2D is a schematic drawing of a cross section of structure 200 along line D–D' in FIG. 2A. The figures referred to herein are for illustrative purposes and are not to scale or to conform in shape with real devices. Also, the arrangement of the diffusion regions in structure 200 can vary depending on the design rules and layout requirement associated with the design and fabrication of an integrated circuit protected by structure 200.

As shown in FIG. 2A, structure 200 comprises P+ diffusion regions 212, 214, and 216. P+ diffusion region 212 is formed in a N-well 252, P+ diffusion region 216 is formed in a P-well 242, and P+ diffusion region 214 is formed in a P-type diffusion region 232, which in turn is formed in P-well 242. Structure 200 further comprises N+ diffusion regions 222, 224, and 226. N+ diffusion regions 224 and 226 are formed in P-well 242, and part of N+ diffusion region 222 is formed in N-well 252 while part of it is formed in the P-type diffusion region 232. The dopant concentration in the P-type diffusion region 232 is higher than that of the P-well but not higher than that of the P+ diffusion regions in structure 200. Structure 200 may further include a N-well/P-well block region 262. The N-well/P-well block region is a region in the semiconductor substrate that has not been subjected to any dopant implant process and thus has a higher sheet resistance than that of the N-well and P-well regions.

As shown in FIGS. 2B–2D, P+ diffusion region 212 and N+ diffusion region 222 are connected to an input or output terminal (or pad) of an integrated circuit (IC) protected by structure 200, and can be called the anode of structure 200. N+ diffusion regions 224 and 226, as well as P+ diffusion region 216, are connected to the ground (or $V_{SS}$) of the IC, and can be called the cathode of structure 200.

Figure 2E:
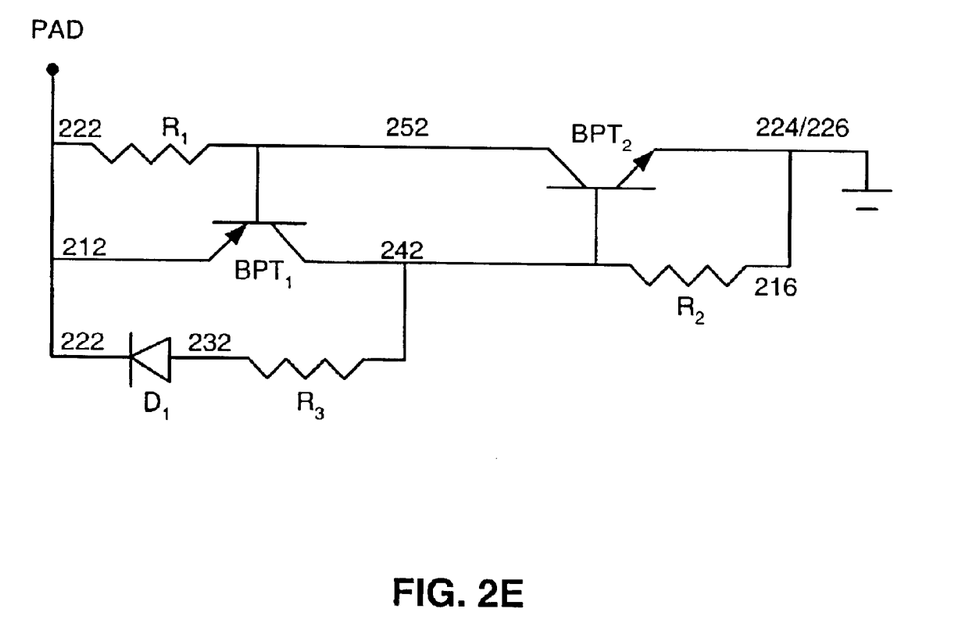
FIG. 2E is a circuit schematic of an ESD protection circuit realized by the ESD protection structure shown in FIGS. 2A–2D.

FIG. 2E is a circuit schematic of structure 200. As shown in FIG. 2E, there are two bipolar transistors, a PNP bipolar transistor $BPT_1$ and a NPN bipolar transistor $BPT_2$, associated with structure 200. P+ diffusion region 212, N-well 252, and P-well 242 form the emitter, base and collector regions, respectively, of the $BPT_1$ transistor. N+ diffusion region 224 or 226, P-well 242, and N-well 252 form the emitter, base and collector, respectively, of the $BPT_2$ transistor. Resistor $R_1$ is formed by the sheet resistance associated with N-well 252, and resistor $R_2$ is formed by the sheet resistance associated with the P-well 242.

Transistors $BPT_1$ and $BPT_2$, and resistors $R_1$ and $R_2$ thus form a lateral SCR structure within structure 200 that can turn on to discharge an ESD pulse sent to the pad.

Structure 200 further includes a diode $D_1$ formed at the PN junction between N+ diffusion region 222 and the P-type diffusion region 232. Resistor $R_3$ represents the resistance between the PN junction of diode $D_1$ and the base of transistor $BPT_2$ (or the collector of transistor $BPT_1$) caused by the sheet resistance of P-well 242 and that of the P-type diffusion region 232. Diode $D_1$ is therefore connected on one side to the pad and on the other side to the ground (or $V_{SS}$) through resistors $R_2$ and $R_3$. Thus, when a positive ESD pulse occurs at the pad, diode $D_1$ becomes reverse biased and can break down, resulting in current flowing from the pad to the P-type diffusion region 232. P+ diffusion region 214 in contact with the P-type diffusion region 232 helps guide the breakdown current through the part of P-well 242 under N+ diffusion region 224 to P+ diffusion region 216, which is connected to ground. When the P-well/N-well blocked region 262 is provided, the higher sheet resistance in this region also helps to restrict the flow of the diode breakdown current toward P+ diffusion 216 in the part of the P-well under N+ diffusion region 224. Because of resistor $R_2$, the breakdown current flow thus raises the electric potential of P-well 242, and turns on transistor $BPT_2$ by causing its base/emitter junction to become forward biased. Once transistor $BPT_2$ turns on, another current starts to flow from the pad through N-well 252 (the collector of transistor $BPT_2$) to N+ diffusion regions 224 and 226 (the emitter of transistor $BPT_2$). Because of resistor $R_1$, this current through N-well 252 puts the electric potential of N-well below that of the P+ diffusion region 212, which is connected directly to the pad, and thus turns on transistor $BPT_1$. The positive feedback of the two transistors is then set up and the SCR structure in structure 200 is triggered to discharge the ESD pulse.

Thus, the triggering of the SCR structure in structure 200 is caused by the avalanche breakdown of the PN junction between N+ diffusion region 222 and the P-type diffusion region 232. Adjustment of the trigger voltage for the SCR structure in structure 200 can be made by adjusting the length L (shown in FIG. 2A) of the N+ diffusion region 224 and thus the P-well resistance in resistor $R_2$. Because both the N+ diffusion region 222 and the P-type diffusion region 232 have much higher dopant concentration than that of a typical N-well and P-well (or P-type substrate) respectively, this breakdown occurs at a lower voltage than the ESD trigger voltage of conventional SCR or LVTSCR structures. In addition, structure 200 offers several other advantages over the conventional ESD structures, as listed in Table 1 below.

TABLE 1

Comparison of ESD Protection Structures

| | LVTSCR 100 | Structure 200 | Percentage of reduction |
| --- | --- | --- | --- |
| Device Area ($\mu m^2$) | ~26.5 × 38 | 21 × 38 | 21% |
| SCR Width ($\mu m$) | 60 | 59 | 2% |
| N+ Size ($\mu m^2$) | 30 × 5 | 2 × 1 | 98.7% |
| N-well Size ($\mu m^2$) | 32 × 8.3 | 30 × 6 | 32% |
| SCR Capacitance (fF) | ~270 fF | <80 fF | >70% |

As shown in Table 1, structure 200 has a much lower capacitance than LVTSCR structure 100. In an SCR device, the size of the N+ diffusion region connected to the pad contributes the most to the SCR capacitance. In structure 200, the size of N+ diffusion region 222 is greatly reduced as compared with the size of N+ diffusion regions 120 in the prior art structure. The size of the N-well also contributes to the capacitance, and in structure, the size of N-well 252 is also significantly reduced as compared with the size of N-well 130 in structure. Therefore, structure 200 is more suitable for high speed applications that require low SCR capacitance, such as SCR capacitance below 100 fF.

Furthermore, although prior art structure 100 has a smaller area as compared with other conventional SCR structures, ESD structure 200 of the present invention occupies an even smaller area on a semiconductor substrate than the prior art ESD structure. As shown in Table 1, an area saving of 21% can result by using structure 200 instead of prior art structure. Although ESD structure 200 occupies smaller area on a semiconductor substrate than prior art structure, the effective SCR width is nearly identical to that of structure 100 The effective SCR width of an SCR structure is part of the perimeter of the P+ anode that faces the N+ cathode. Thus, in structure, the SCR width is two times the length A of the diffusion region 110 (or 122), and in structure 200, the SCR width is the total length running from point a to point b to point c to point d to point e on the edge of the P+ anode 212, which is almost the total perimeter of the P+ anode 212.

Moreover, because structure 200 uses no MOS-like structures, there is no possibility of gate oxide breakdown during an ESD event. Also due to the absence of the NMOS transistors in structure 200, the base width of the bipolar transistor that turns on first in response to an ESD pulse can be made much smaller. Thus, the turn-on speed of the SCR structure in structure 200 can be made much faster than the turn-on speed of the SCR structure in structure. As shown in FIG. 2A, in structure 200, the bipolar transistor that turns on first is $BPT_2$ and its base width is the distance W from the N+ cathode 226 or 224 to the N-well 252. Distance W can be made to be the shortest distance between an N+ diffusion and an N-well allowable by the design rules associated with the fabrication technology for manufacturing the IC that includes structure 200. In structure, however, the bipolar transistor that turns on first is $BPT_{npn}$, and its base width $\omega$, as shown in FIG. 1A, is the distance from the N+ cathode 122 to N-well 130, which is separated from the N+ cathode 122 by N+ anode 120 and gate 150. The base width of $BPT_{npn}$ in structure 100 is therefore much longer, resulting in a slower turn-on speed.

Figure 3:
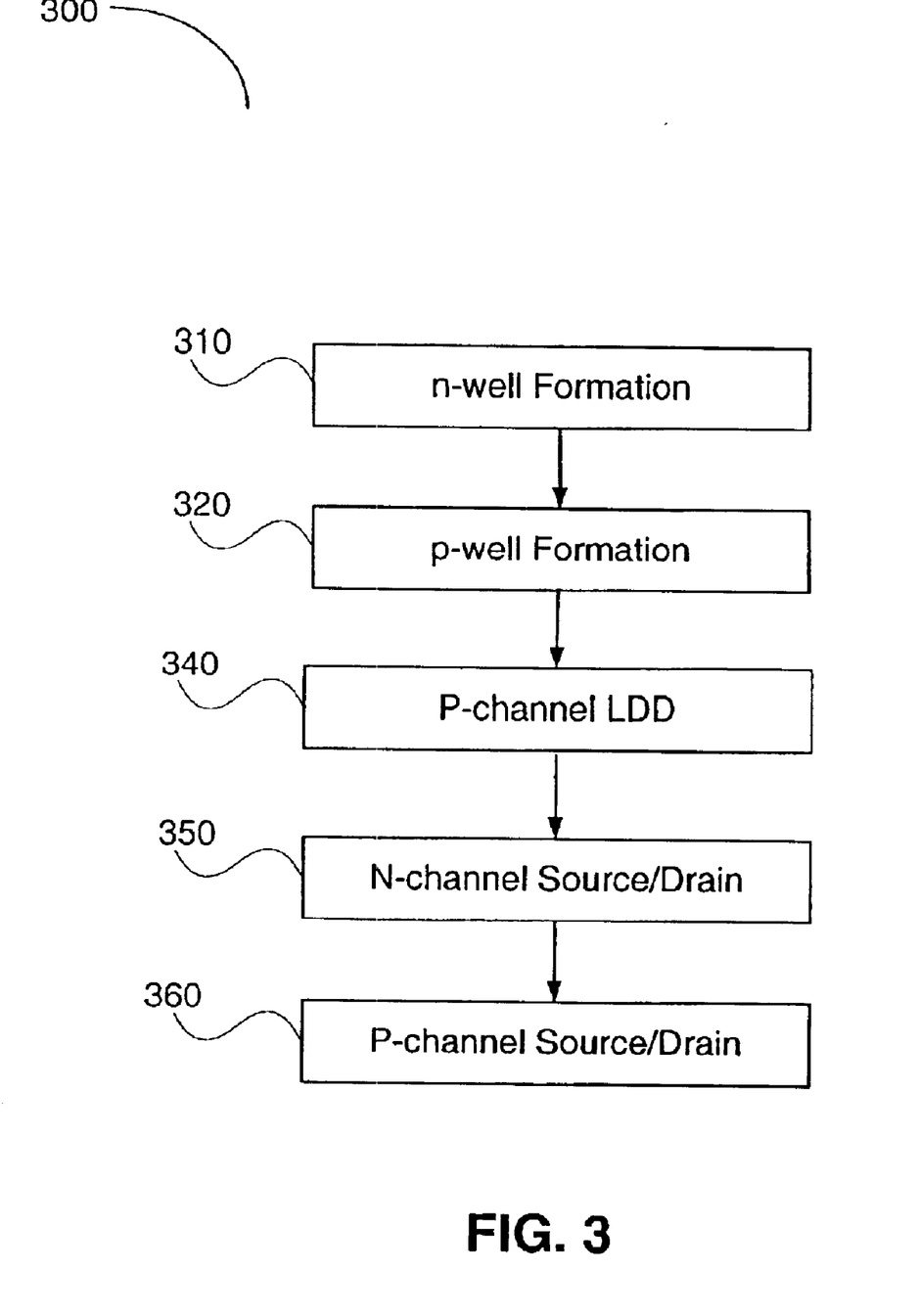
FIG. 3 is a flow chart illustrating a process for fabricating the ESD protection structure on a semiconductor substrate according to one embodiment of the present invention.

As another advantage of ESD structure 200, all of the diffusion regions in structure 200 can be formed using process steps for fabricating a conventional CMOS IC, which is protected by structure 200, and no additional masking steps are needed to form the diffusion regions in structure 200. FIG. 3 is a flow chart illustrating a process 300 for fabricating the ESD protection structure 200 on a semiconductor substrate according to one embodiment of the present invention. As shown in FIG. 3, process 300 comprises process step 310 for forming N-well 252. Step 310 can involve the same IC fabrication steps associated with the formation of other N-wells in the CMOS IC protected by structure 200. One of these IC fabrication steps can be an N-well implant process step, during which, a N-well mask typically made of photoresist is applied to the substrate exposing substrate areas corresponding to N-well 252 and other N-wells of the CMOS IC.

Process 300 further comprises process step 320 for forming P-well 242. Again, step 320 can involve the same IC fabrication steps associated with the formation of other P-wells in the CMOS IC protected by structure 200. One of these IC fabrication steps can be a P-well implant process step, during which, a P-well mask typically made of photoresist is applied to the substrate exposing substrate areas corresponding to P-well 242 and other P-wells of the CMOS IC. The P-well/N-well block region 262 can formed by blocking the substrate area corresponding to the P-well/N-well block region 262 during the P-well and N-well implant processes using the same N-well and P-well masks during steps 310 and 320.

Process 300 further comprises process step 340 for forming the P-type diffusion region 232. Step 340 can involve the same IC fabrication steps for forming P-channel lightly doped drain (PLDD) regions in the CMOS IC protected by structure 200. One of these IC fabrication steps can be a PLDD implant process step, during which, a PLDD mask typically made of photoresist is applied to the substrate exposing substrate areas corresponding to the P-type diffusion region 232 and other PLDD regions of the CMOS IC.

Process 300 further comprises process step 350 for forming the N+ diffusion regions 222, 224, and 226 in structure 200. Step 350 can involve the same IC fabrication steps associated with the formation of the N+ source/drain regions in the CMOS IC protected by structure 200. One of these IC fabrication steps can be an N+ source/drain implant process step, during which, a N+ mask typically made of photoresist is applied to the substrate exposing substrate areas corresponding to N+ diffusion regions 222, 224, and 226, and other N+ source drain regions of the CMOS IC.

Process 300 further comprises step 360 for forming the P+ diffusion regions 212, 214, and 216 in structure 200. Again step 360 can involve the same IC fabrication steps associated with the formation of the P+ source/drain regions in the CMOS IC protected by structure 200. One of these IC fabrication steps can be an P+ source/drain implant process step, during which, a P+ mask typically made of photoresist is applied to the substrate exposing substrate areas corresponding to P+ diffusion regions 212, 214 and 216, and other P+ source drain regions of the CMOS IC. Therefore, no additional IC fabrication steps in addition to the ones involved in the fabrication of a conventional CMOS IC protected by structure 200 are required to form structure 200 on a semiconductor substrate.

Thus, all of the diffusion regions of structure 200, including the diffusion regions 212, 252, 242, 224 and 226 of the bipolar transistors $BPT_1$ and $BPT_2$, and the two diffusion regions 222 and 232 of the triggering diode $D_1$, are formed during process 300, which is part of the fabrication process for fabricating the CMOS IC protected by structure 200. In particular, one of the two diffusion regions of the triggering diode $D_1$, i.e., diffusion region 232, is formed using a lightly doped drain implant process for forming lightly doped drain regions in the CMOS IC protected by structure 200.

Structure 200 can be used to protect NMOS devices in an input or output circuit of an integrated circuit. A complementary structure of structure 200 can be used to protect PMOS devices. In particular, by changing the conductivity type of each diffusion region in structure 200 to its opposite conductivity type, for example, by changing P+ diffusions 212, 214, and 216 to N+ diffusions, N+ diffusions 222, 224 and 226 to P+ diffusions, P-well 242 to an N-well, N-well 252 to a P-well, and P-type diffusion region 232 to an N-type diffusion region, structure 200 can be used to protect PMOS devices in an input or output circuit of an integrated circuit. Also, dopant concentrations in the diffusion regions of structure 200 can vary. For example, when the CMOS IC protected by structure 200 uses P++ or N++ diffusion regions for the sources and drains of its MOS devices, P+ diffusions 212, 214 and 216 can be P++ diffusion regions, and N+ diffusion regions 222, 224, and 226 can be N++ diffusion regions.

Although the present invention has been described in detail, it should be understood that various changes, substitutions, and alterations can be made hereto without departing from the spirit and scope of the invention as defined by the appended claims.

We claim:

1. An ESD protection structure for protecting an integrated circuit, comprising:
    a semiconductor controlled rectifier (SCR) structure having a first diffusion region and a second diffusion region of opposite conductivity types, both of said first diffusion region and second diffusion region being electrically connected to a pad of said ESD protection structure; and
    a third diffusion region adjacent said second diffusion region and formed using a lightly doped drain (LDD) implant process for forming lightly doped drain regions in said integrated circuit, and
    wherein said second diffusion region and said third diffusion region form a triggering diode that breaks down in response to an ESD pulse on said pad of said ESD protection structure, and wherein said second diffusion region is small compared to said first diffusion region to reduce an SCR capacitance associated with said ESD protection structure.

2. The ESD protection structure of claim 1 wherein said SCR structure further comprises a fourth diffusion region having an opposite conductivity type as said first diffusion region and facing more than one side of said first diffusion region.

3. The ESD protection structure of claim 1 wherein said second diffusion region faces a small portion of a perimeter of said first diffusion region.

4. The ESD protection structure of claim 2 wherein said SCR structure comprises:
    a first well in a semiconductor substrate, in which said first diffusion region is situated, wherein said first diffusion region and said first well are of opposite conductivity types; and
    a second well in said semiconductor substrate, in which said fourth diffusion region is situated.

5. The ESD protection structure of claim 4 wherein said second well 242 contacts said first well on more than one side of said first well.

6. The ESD protection structure of claim 4 wherein when said triggering diode breaks down in response to said ESD pulse, a breakdown current flows in said second well, causing said SCR structure to turn on and discharge current to flow between said first diffusion region and said fourth diffusion region.

7. The ESD protection structure of claim 6, further comprising a fifth diffusion region in contact with said third diffusion region and a sixth diffusion region formed in said second well and electrically connected to said fourth diffusion region, wherein said breakdown current flows through a part of said second well under said fourth diffusion region and between said fifth diffusion region and said sixth diffusion region.

8. The ESD protection structure of claim 4 wherein said third diffusion region is adjacent to said first well, and said second diffusion region is partially located in said first well.

9. The ESD protection structure of claim 7, further comprising a N-well/P-well block region that serves to restrict the flow of the breakdown current between said fifth diffusion region and said sixth diffusion region in the part of the second well under said fourth diffusion region.

10. The ESD protection structure of claim 4, wherein said first well is made small compared to said second well to reduce the SCR capacitance associated with said ESD protection structure.

11. An ESD protection structure fabricated in a semiconductor substrate, comprising:
    a first diffusion region in a first well in said semiconductor substrate, wherein said first diffusion region and said first well are of opposite conductivity types;
    second diffusion regions each having an opposite conductivity type as that of said first diffusion region and in a second well in said semiconductor substrate, wherein said second well has an opposite conductivity type as that of said first well and contacts side first well on more than one side of said first well, and wherein said second diffusion regions face more than one side of said first diffusion region;

a third diffusion region near said first well and having a same conductivity type as that of said first diffusion region, wherein a dopant concentration in said third diffusion region is significantly higher than that of said first well but not higher than that of said first diffusion region; and a fourth diffusion region in contact with said first well and said third diffusion region, wherein said fourth diffusion region and said third diffusion region form a PN junction that breaks down in response to an ESD pulse on said first diffusion region and said fourth diffusion region, thereby turning on the ESD protection structure to discharge the ESD pulse.

12. The ESD protection structure of claim 11, wherein said fourth diffusion region is made small compared to said first diffusion region to reduce an SCR capacitance associated with said ESD protection structure.

13. The ESD protection structure of claim 12 wherein said first well is made small compared to said second well to further reduce the SCR capacitance associated with said ESD protection structure.

14. The ESD protection structure of claim 11 wherein a discharge current flows between said first diffusion region and at least one of said second diffusion regions when said ESD structure is turned on to discharge said ESD pulse.

15. The ESD protection structure of claim 11, further comprising a fifth diffusion region in contact with said third diffusion region and a sixth diffusion region in said second well, wherein when said PN junction breaks down, a breakdown current flows under one of said second diffusion regions and between said fifth diffusion region and said sixth diffusion region.

16. The ESD protection structure of claim 11, further comprising a N-well/P-well block region adjacent to said second well.

17. A semiconductor-controlled rectifier (SCR) built on a semiconductor substrate for protecting an integrated circuit also built on said semiconductor substrate from electrostatic damage, comprising:

a first diffusion region electrically connected to a first terminal of said integrated circuit and having a first conductivity type in a first well having a second conductivity type that is opposite to said first conductivity type;

a second diffusion region electrically connected to a second terminal of said integrated circuit and having the second conductivity type;

a third diffusion region having the first conductivity type near said first well, wherein a dopant concentration in said third diffusion region is significantly higher than a dopant concentration in said first or second well but not higher than a dopant concentration in said first diffusion region; and a fourth diffusion region having the second conductivity type and electrically connected to said first terminal, wherein said fourth diffusion region and said third diffusion region form a triggering diode that breaks down in response to an electric pulse on said fourth diffusion region thereby turning on the SCR; and wherein the first, second, third, and fourth diffusion regions and the first and second wells are arranged on the semiconductor substrate such that a base width associated with a bipolar transistor formed by the first well, the second well, and the second diffusion region can be as small as a shortest distance between a diffusion and a well of opposite conductivity types allowable by design rules associated with a fabrication technology for manufacturing the integrated circuit.

18. The SCR of claim 17 further comprising a fifth diffusion region having the second conductivity type and electrically connected to said second diffusion region, wherein said fifth diffusion region faces more than one side of said first diffusion region.

19. The SCR of claim 17, further comprising a sixth diffusion region having the first conductivity type in contact with said third diffusion region, and a seventh diffusion region having the first conductivity type in said second well and electrically connected to said second terminal, wherein said sixth and seventh diffusion regions are on opposite sides of said second diffusion region.

20. The SCR of claim 17, further comprising a N-well/P-well block region adjacent to said second well.

* * * * *